(12) United States Patent
Hsu et al.

(10) Patent No.: US 7,560,993 B2
(45) Date of Patent: Jul. 14, 2009

(54) AMPLIFIER

(75) Inventors: Yung-Jane Hsu, Hsinchu (TW);
Po-Ching Chen, Hsinchu (TW);
Jing-Yuan Cheng, Hsinchu (TW)

(73) Assignee: Frontend Analog and Digital Technology Corporation, Hsinchu (TW)

( * ) Notice: Subject to any disclaimer, the term of this patent is extended or adjusted under 35 U.S.C. 154(b) by 106 days.

(21) Appl. No.: 11/812,267

(22) Filed: Jun. 18, 2007

(65) Prior Publication Data
US 2008/0278242 A1    Nov. 13, 2008

(30) Foreign Application Priority Data
May 11, 2007    (TW) ............... 96116933 A

(51) Int. Cl.
*H03F 3/04*    (2006.01)

(52) U.S. Cl. ............ 330/296; 330/129; 330/277
(58) Field of Classification Search ........ 330/296, 330/129, 277
See application file for complete search history.

(56) References Cited

U.S. PATENT DOCUMENTS

| | | | | | |
|---|---|---|---|---|---|
| 3,950,708 | A | * | 4/1976 | Hall | 330/285 |
| 3,952,257 | A | * | 4/1976 | Schade, Jr. | 330/288 |
| 4,030,042 | A | * | 6/1977 | Limberg | 330/288 |
| 4,055,774 | A | * | 10/1977 | Ahmed | 327/538 |
| 4,095,164 | A | * | 6/1978 | Ahmed | 323/226 |
| 4,160,201 | A | * | 7/1979 | Ahmed | 323/226 |

\* cited by examiner

*Primary Examiner*—Patricia Nguyen
(74) *Attorney, Agent, or Firm*—Rosenberg, Klein & Lee

(57) ABSTRACT

An amplifier has a self-bias circuit to generate the bias voltage for the input of the amplifying circuit in the amplifier, thereby simplifying the circuit complexity to reduce the size and cost of the amplifier.

24 Claims, 8 Drawing Sheets

AMPLIFIER

FIELD OF THE INVENTION

The present invention is related generally to an amplifier and, more particularly, to a self-biased amplifier.

BACKGROUND OF THE INVENTION

The input impedance and input bias are two important factors of the design of an amplifier. For instance, to amplify a signal from a high output impedance signal source, the input stage of the amplifier must have high input impedance to reduce the signal attenuation resulted from signal coupling loss. However, if an amplifying circuit with high amplification is employed in the input stage of the amplifier, the larger size of the circuit components would result in smaller input impedance, which in turn prevents the signal from the high output impedance signal source from being coupled to the amplifier completely, and consequently lead to signal attenuation. The conventional amplifiers often use bias circuits to provide the desired high input impedance thereof, though this gives rise to other problems. On the other hand, the output bias needed at the output of the signal source often differs from the input bias at the input stage of the amplifier, which hinders the direct connection between the amplifier and the signal source. If an amplifier configuration can allow adequate bias for the output of the signal source, the input bias adaptability of the amplifier can be enhanced and the amplifier can be suitable for various signal sources, thus widening the applications of the amplifier.

When designing the circuitry of an amplifier, factors such as cost and overall size of the circuit must be taken into account, and this is especially true if other factors like noise reduction may be overlooked, where the cost and the size of the amplifier are the most critical factors to consider. Provided that the performance of the amplifier is not overly compromised, reducing the size of the amplifier, such as integration into a single chip, and lowering the cost are the top priority for the designers of the amplifiers currently.

U.S. Pat. No. 3,595,998 proposed a preamplifier for microphones which uses a polarity-dependent bias circuit to control the gate voltage of the FET of an amplifier, and provides individual bias for the signal source of the amplifier. However, the polarity-dependent bias circuit is complex and huge and, as described in U.S. Pat. No. 6,812,788, it is required to have a resistance up to tens or even hundreds of GΩ and will induce severe noise problem. In addition, to provide so much resistance, external resistor is required, thereby causing that the circuitry cannot be miniaturized and has higher cost.

U.S. Pat. No. 5,337,011 proposed a preamplifier for microphones which uses two cascode stages to improve the impedance matching, in order to prevent severe gain loss and inhibit noises. Unfortunately, this circuit is also complex and never solves the adaptability problem of the input bias.

U.S. Pat. No. 7,110,560 proposed a preamplifier for microphones which uses a pair of cross-coupled diodes to provide high input impedance, and a coupling capacitor to prevent DC leakage. However, the cross-coupled diodes at the input will introduce other problems as described in U.S. Pat. Publication No. 20030194100, and further, this art still cannot solve the adaptability problem of the input bias.

U.S. Pat. Publication No. 20030194100 proposed an input buffer bias circuit for microphones which uses a current limiter to limit the current of the cross-coupled input bias diodes to increase the voltage level of the input signal. However, this art still do not solve the adaptability problem of the input bias.

U.S. Pat. No. 6,888,408 proposed a preamplifier for microphones which uses a two-stage amplifier to replace the conventional junction transistor (JFET), and in which the first stage amplifier minimizes the input capacitance, and the second stage amplifier optimizes the gain. However, the first stage amplifier must be designed to match the output capacitance of the signal source, and thus it is designed according to the signal sources of various output capacitances one by one, which not only restricts the applications of the amplifier but also increases the cost. In-addition, this art does not solve the adaptability problem of the input bias.

U.S. Pat. Publication No. 20050151589 proposed an amplifying circuit of a capacitive transducer, which also uses a pair of cross-coupled diodes to provide high input impedance, and a servo-amplifier to feed back the output to the pair of cross-coupled diodes in order to control the input bias point. However, the cross-coupled diodes at the input will induce other problems, and this art still does not solve the adaptability problem of the input bias.

U.S. Pat. No. 6,812,788 proposed an amplifying circuit for a capacitive microphone which uses independent bias power supplies to set the bias voltages of the signal source and the amplifier input respectively, and a network of diodes and resistors with high resistance to replace conventional coupling resistor with high resistance and feed back the output to the input coupling network. However, this art needs two bias power supplies and uses the input coupling network for providing high input impedance, resulting in increased complexity and cost of the amplifier circuit design.

SUMMARY OF THE INVENTION

An object of the present invention is to provide an amplifier with independent input bias.

Particularly, one object of the present invention is to provide an amplifier with self-biased input.

Another object of the present invention is to provide an amplifier with high input impedance.

Particularly, one object of the present invention is to provide an amplifier suitable to high output impedance signal sources.

Yet another object of the present invention is to provide an amplifier that may be integrated in a single chip.

Particularly, one object of the present invention is to provide an amplifier with lower complexity and cost.

An amplifier according to the present invention comprises a signal source input to receive an input signal, a load connected to an amplifying circuit, and a self-bias circuit connected to an input of the amplifying circuit for biasing the input of the amplifying circuit at a DC level, wherein the load and the self-bias circuit are in the current path of the amplifying circuit with the amplifying circuit therebetween.

Alternatively, the amplifier further comprises a coupling circuit connected between the signal source input and the input of the amplifying circuit for coupling the input signal from the signal source input to the amplifying circuit, such that the signal source input and the input of the amplifying circuit are biased independently, and a bias circuit connected between a supply voltage and the signal source input for biasing the signal source input at a second DC level.

With the configuration of the coupling circuit and the bias circuits, the signal source input and the input of the amplifying circuit can be biased with a single bias, or at two independent biased DC levels.

Because the input of the amplifying circuit employs a self-bias circuit, the circuits thereof can be simplified and the cost is reduced.

The coupling circuit may be implemented with capacitor, diode, or diode-configured transistor.

The bias circuit may be short circuit, resistor, diode, diode-configured transistor, or combination thereof.

The amplifying circuit may employ single-stage amplifying transistor, differential pair, cascode amplifying circuit, or cascade amplifying circuit.

BRIEF DESCRIPTION OF THE DRAWINGS

The present invention can be more fully understood by reading the subsequent detailed description and examples with references made to the accompanying drawings; wherein.

DETAILED DESCRIPTION OF THE INVENTION

Figure 1:
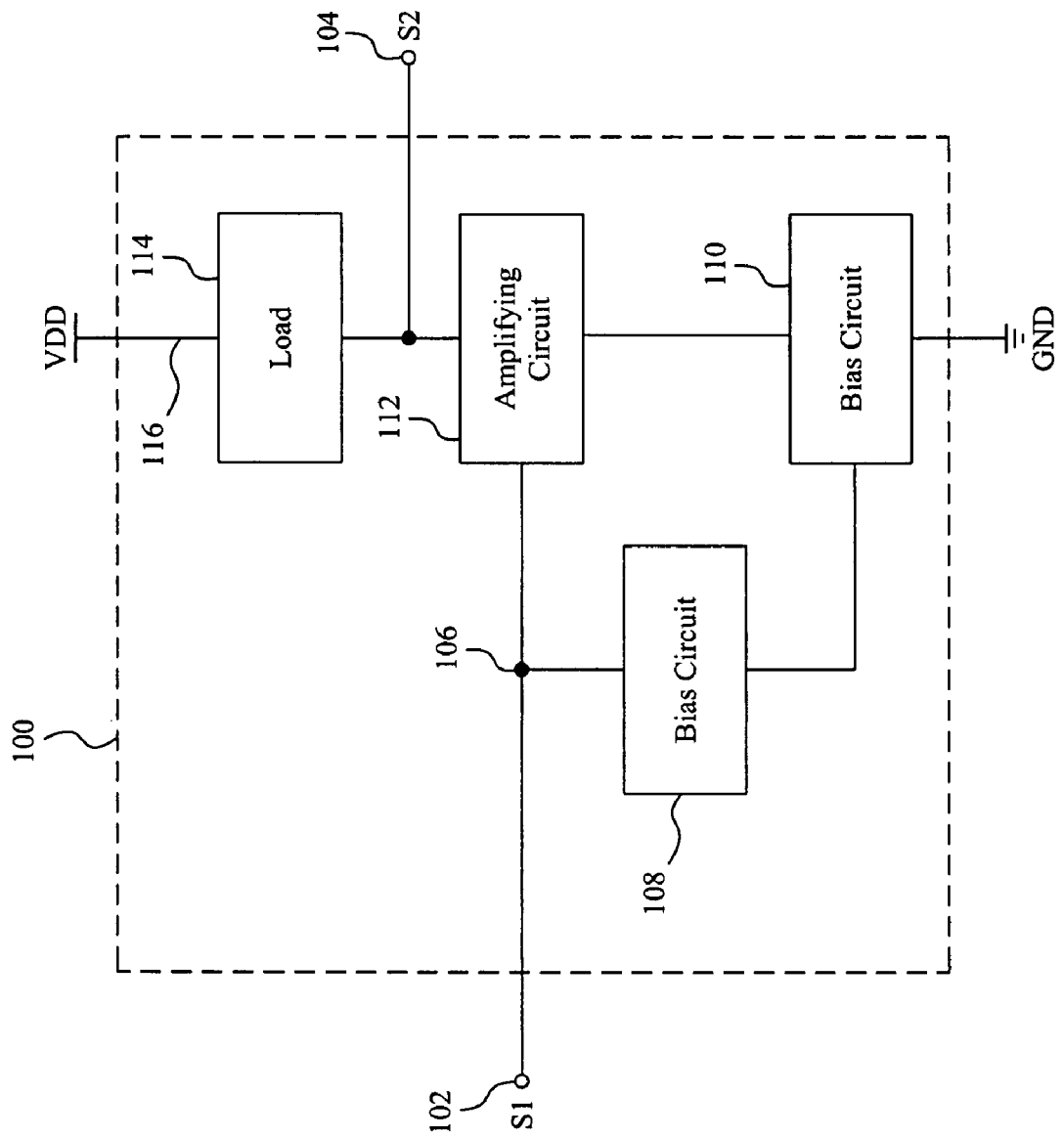
FIG. 1 schematically shows a first embodiment according to the present invention.

FIG. 1 schematically shows a first embodiment according to the present invention, in which an amplifier 100 has a signal source input 102 to be connected with a signal source, such as to an output of a signal source with high output impedance, for receiving an input signal S1 therefrom, to be further amplified by an amplifying circuit 112 to generate an output signal S2 at an output 104, a power input 116 of the amplifying circuit 112 is connected with an external supply voltage VDD in order to activate the amplifying circuit 112, a load 114 is located in a current path of the amplifying circuit 112 and connected between the power input 116 and the amplifying circuit 112, a bias circuit 110 is connected in the current path of the amplifying circuit 112 on the opposite side of the amplifying circuit 112, a bias circuit 108 is connected between an input 106 and the bias circuit 110 such that the bias circuits 108 and 110 constitute a self-bias circuit for generating low voltage as the bias of the input 106 and the signal source input 102, and thus it is not required to provide an additional supply voltage to generate the bias of the input 106 and the signal source input 102. Moreover, because the bias of the input 106 and the signal source input 102 is generated via the self-bias circuit that is connected at the opposite side to where the amplifying circuit 112 is connected to the load 114, the bias may be varied by modifying a design thereof, and the bias will not be varied along with changes in the load 114, thus the resultant bias is more stable. All of the components of the aforementioned amplifier 100 may be integrated in a single chip.

Figure 2:
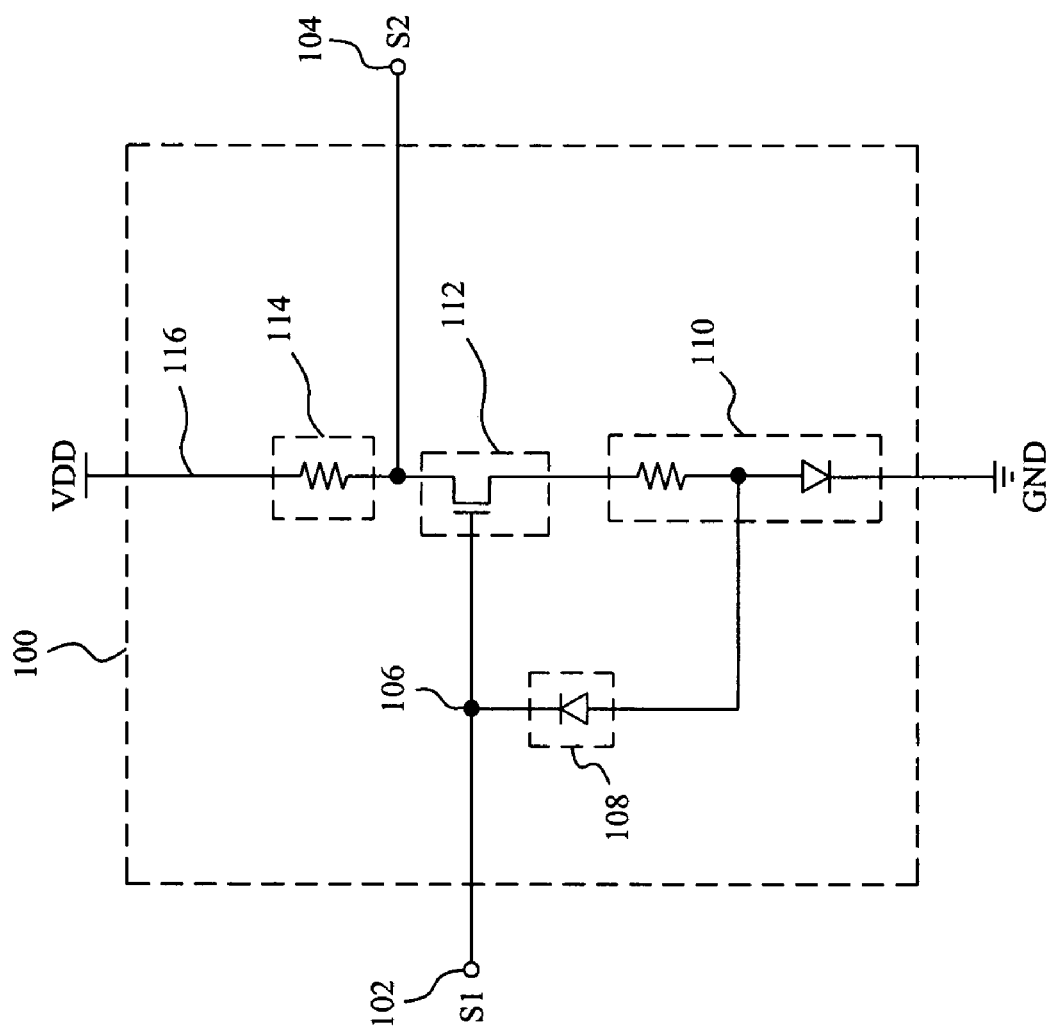
FIG. 2 shows an example of the amplifier in FIG. 1.

Referring to an example shown in FIG. 2, the load 114 is a resistor, the bias circuit 108 is a reverse-biased diode, the bias circuit 110 comprises a resistor connected with a forward-biased diode in series, and the amplifying circuit 112 is a single-stage amplifying transistor, such as PMOSFET. In different embodiments, the bias circuits 108 and 110 may be selected from short circuit, resistor, diode, or combination thereof. As is well known, the diode may be diode-configured transistor, and the amplifying circuit 112 may employ differential pair, cascode amplifying circuit, or cascade amplifying circuit.

Figure 3:
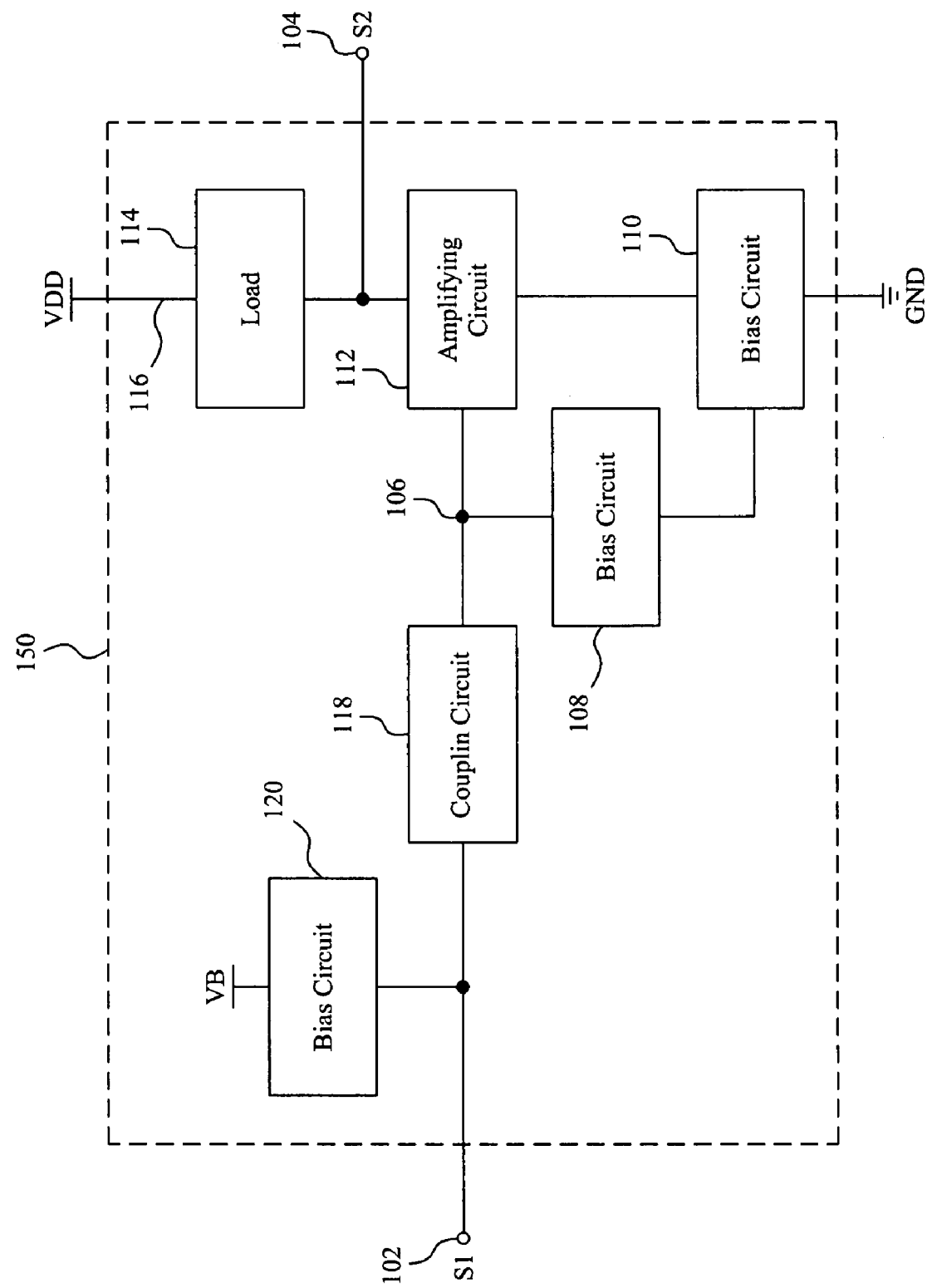
FIG. 3 schematically shows a second embodiment according to the present invention.

FIG. 3 schematically shows a second embodiment according to the present invention, in which an amplifier 150 comprises not only the structure shown in FIG. 1, but also a coupling circuit 118 connected between the signal source input 102 and the input 106 of the amplifying circuit 112, so that the signal source input 102 and the input 106 of the amplifying circuit 112 can be biased independently, and a bias circuit 120 is connected between a supply voltage VB and the signal source input 102 for biasing the signal source input 102 at a DC voltage. Therefore, the signal source input 102 and the input 106 of the amplifying circuit 112 can be biased at different DC levels, so that an output of the signal source can be coupled to the amplifying circuit 112 with minimal loss. Because the signal source input 102 and the input 106 of the amplifying circuit 112 are independently biased, the amplifier 150 is adaptive to different signal sources. All of the components of the aforementioned amplifier 150 may be integrated in a single chip.

Figure 4:
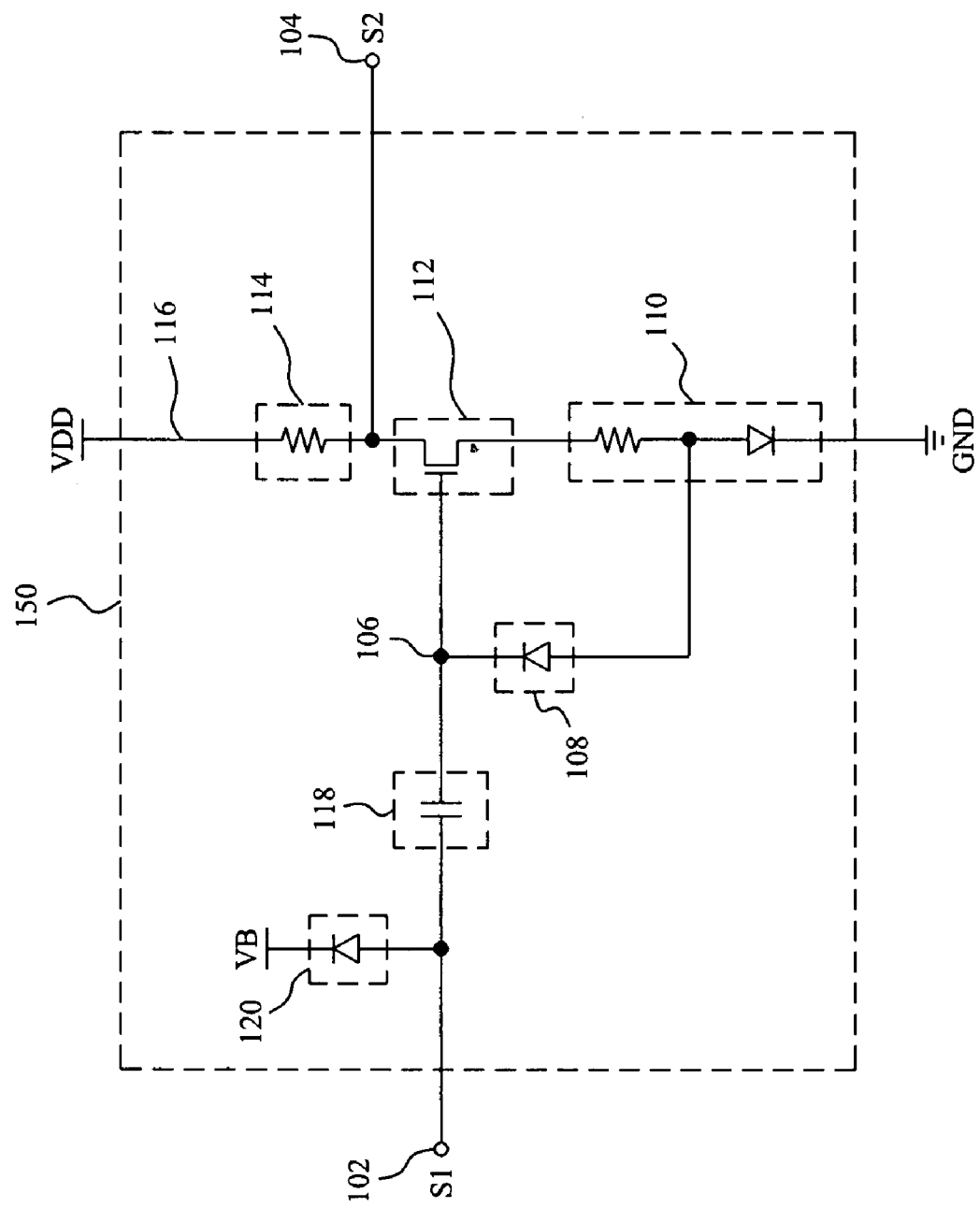
FIG. 4 shows an example of the amplifier in FIG. 3.

Referring to another embodiment shown in FIG. 4, the coupling circuit 118 is a capacitor. As is well known, this capacitor may be implemented with the structure of polysilicon-insulator-diffusion, metal-insulator-diffusion, polysilicon-insulator-polysilicon, metal-insulator-polysilicon, or metal-insulator-metal on a semiconductor chip. The load 114 is a resistor, the bias circuit 120 is a reverse-biased diode, the bias circuit 108 is also a reverse-biased diode, the bias circuit 110 comprises a resistor connected with a forward-biased diode in series, and the amplifying circuit 112 is a single-stage amplifying transistor, such as PMOSFET. In different embodiments, the coupling circuit 118 may employ a reverse-biased diode or any other circuits that allow the signal source input 102 and the input 106 of the amplifying circuit 112 to be independently biased, the bias circuits 108, 110 and 120 may be selected from short circuit, resistor, diode, diode-configured transistor, or combination thereof, and the amplifying circuit 112 may employ differential pair, cascode amplifying circuit, or cascade amplifying circuit.

Figure 5:
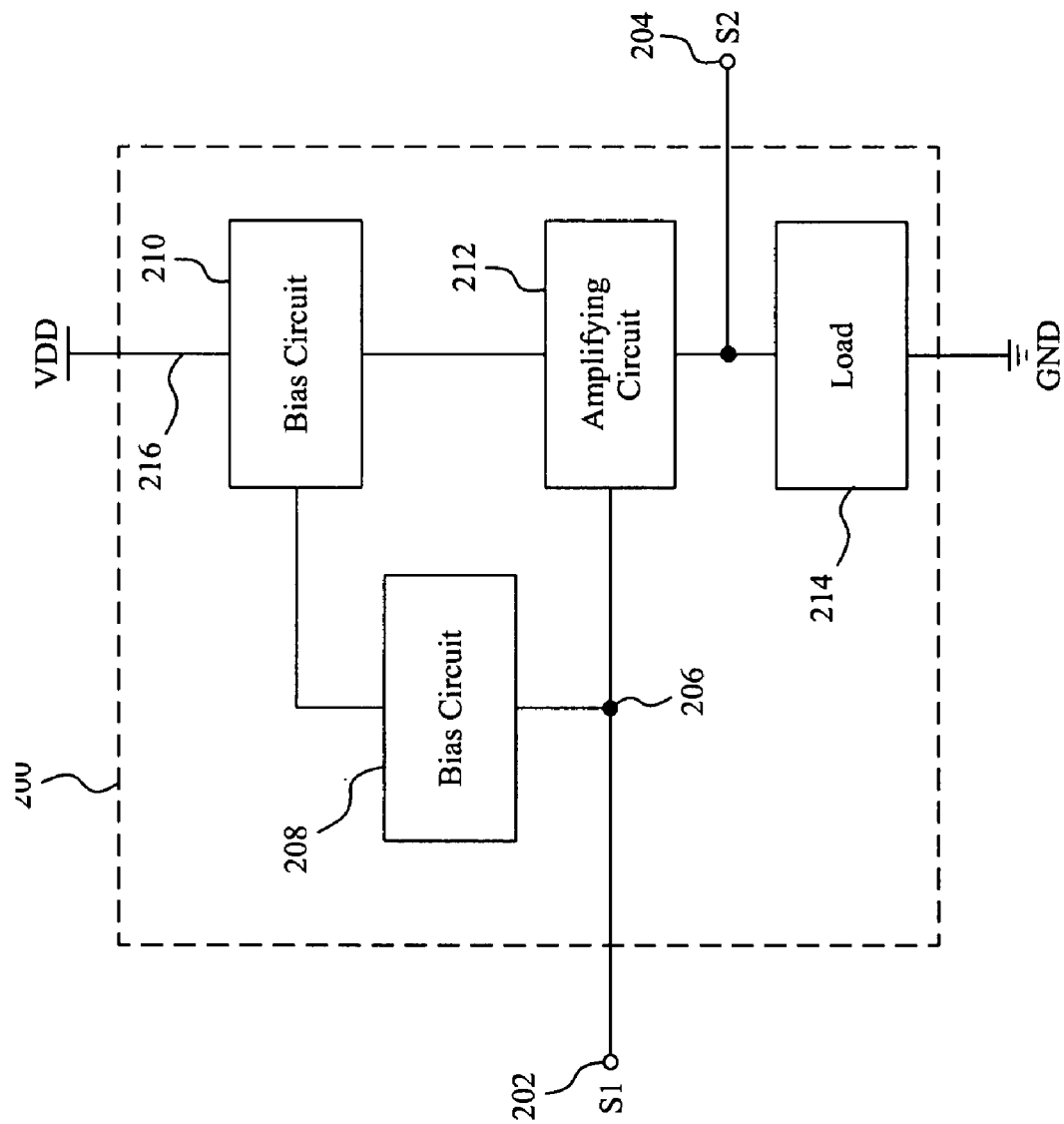
FIG. 5 schematically shows a third embodiment according to the present invention.

FIG. 5 schematically shows a third embodiment according to the present invention, in which an amplifier 200 comprises a signal source input 202 for receiving an input signal S1, and an amplifying circuit 212 connected with an external supply voltage VDD by a power input 216, so as to amplify the input signal S1 for generating the output signal S2 at an output 204. A load 214 is located in a current path of the amplifying circuit 212 and connected between the amplifying circuit 212 and ground GND, a bias circuit 210 is connected in the current path of the amplifying circuit 212 at the opposite side of the amplifying circuit 212 to the load 214, a bias circuit 208 is connected between an input 206 of the amplifying circuit 212 and the bias circuit 210, the bias circuits 208 and 210 constitute a self-bias circuit for generating high voltage as the bias of the input 206 of the amplifying circuit 212 and the signal source input 202, and thus it is not required to provide an additional supply voltage to generate the bias voltage for the input 206 and the signal source input 202. Moreover, because the bias of the input 206 and the signal source input 202 is generated via the self-bias circuit that is connected at the opposite side to where the amplifying circuit 212 is connected to the load 214, the bias may be varied by modifying the design thereof, and the bias will not be varied along with changes in the load 214, thus the resultant bias is more stable. Similarly, the bias circuits 208 and 210 may be selected from short circuit, resistor, diode, diode-configured transistor, or combination thereof, the amplifying circuit 212 may employ single-stage amplifying transistor, differential pair, cascode amplifying circuit, or cascade amplifying circuit. All of the components of the aforementioned amplifier 200 may be integrated in a single chip.

Figure 6:
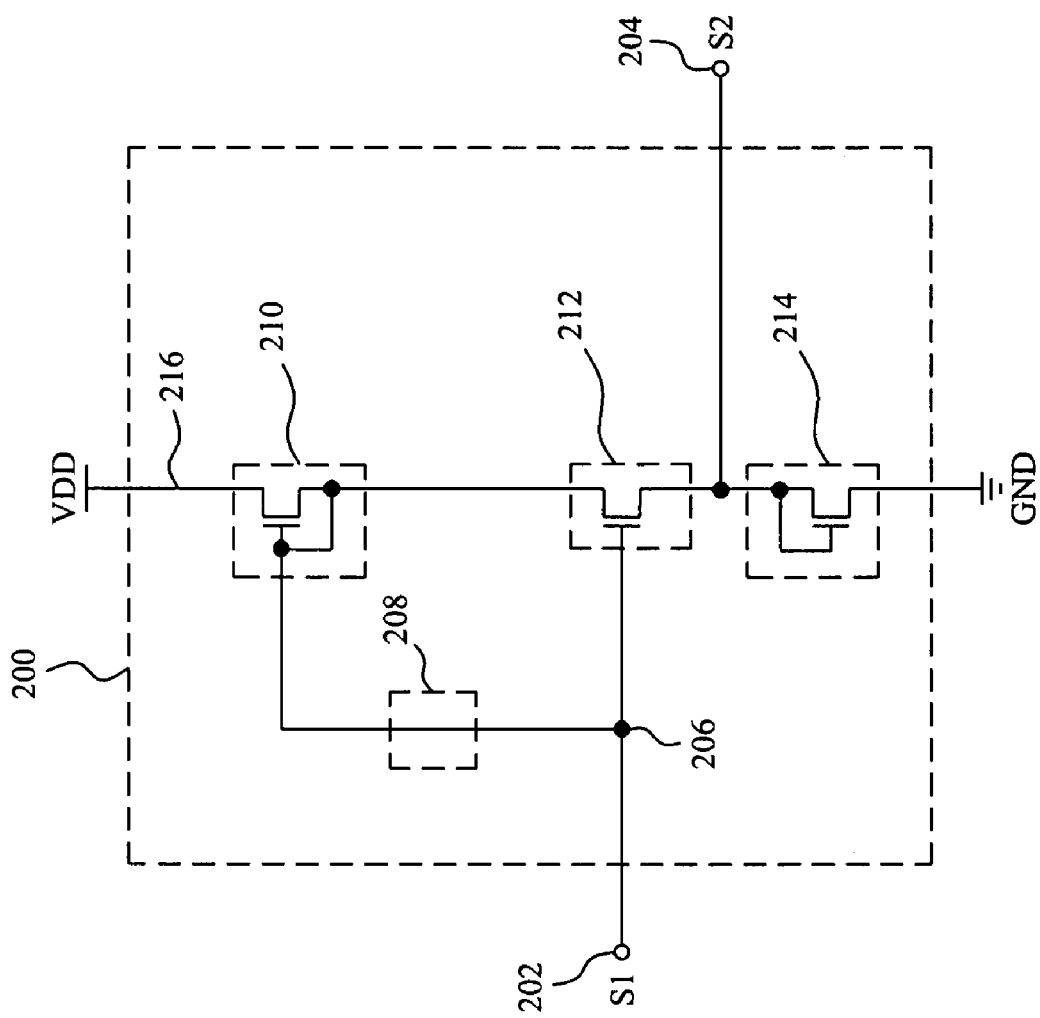
FIG. 6 shows an example of the amplifier in FIG. 5.

FIG. 6 shows an example of the amplifier 200 in FIG. 5, in which the bias circuit 208 is a short circuit, the bias circuit 210 is a diode-configured transistor, the amplifying circuit 212 employs a single-stage amplifying transistor, such as NMOS-FET, and the load 214 is a diode-configured transistor.

Figure 7:
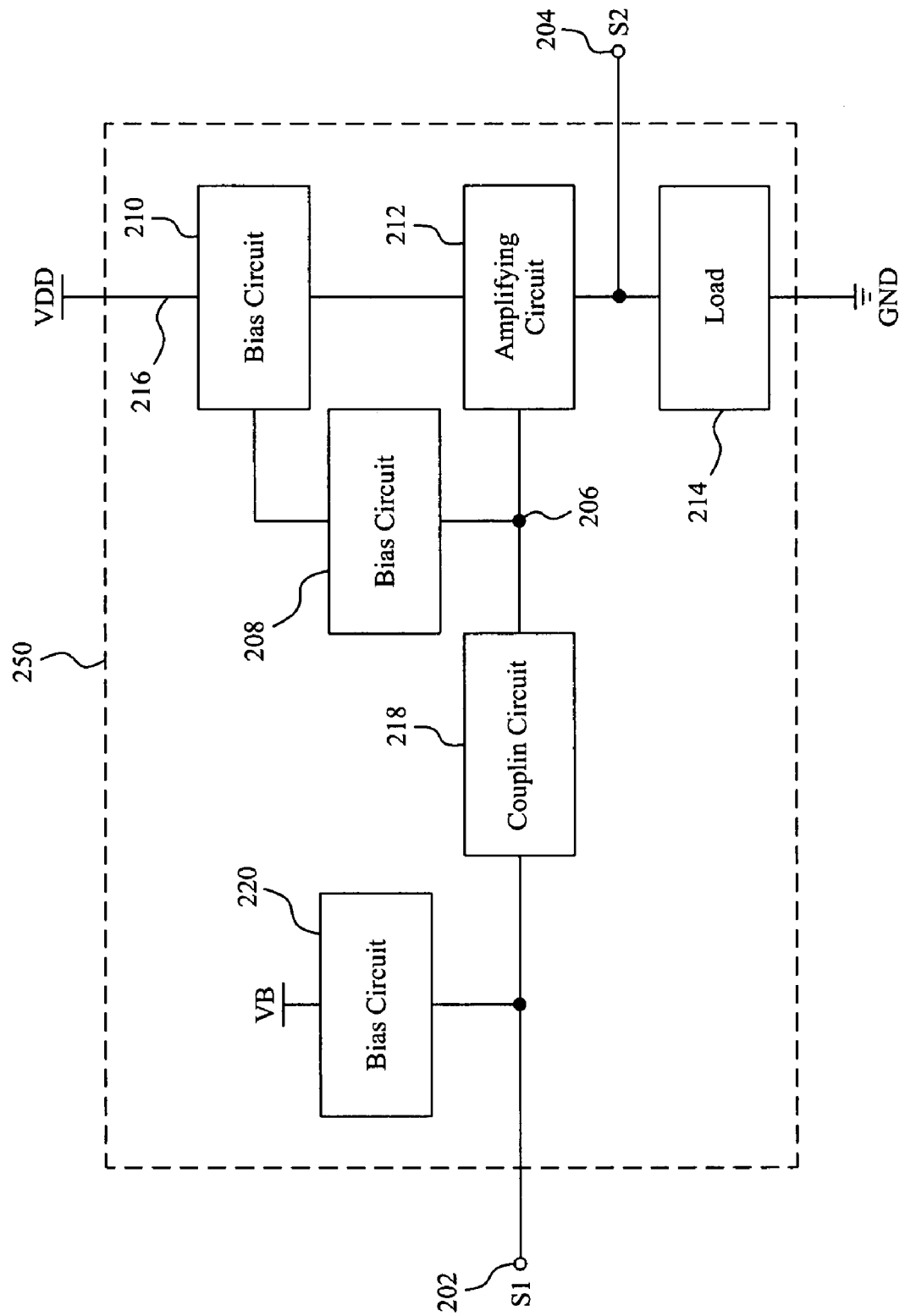
FIG. 7 schematically shows a fourth embodiment according to the present invention.

FIG. 7 schematically shows a fourth embodiment according to the present invention, in which an amplifier 250 comprises not only the structure shown in FIG. 5, but also a coupling circuit 218 connected between the signal source input 202 and the amplifying circuit 212, and a bias circuit 220 connected between the supply voltage VB and the signal source input 202. Therefore, the signal source input 202 and the input 206 of the amplifying circuit 212 can be biased at different DC voltages, so that the amplifier 250 is adaptive to different signal sources. Similarly, the coupling circuit 218 may use capacitor, diode, or any other circuits that allow the signal source input 202 and the input 206 of the amplifying circuit 212 to be independently biased, and the capacitor may be implemented with the structure of polysilicon-insulator-diffusion, metal-insulator-diffusion, polysilicon-insulator-polysilicon, metal-insulator-polysilicon, or metal-insulator-metal on a semiconductor chip. The bias circuits 208, 210 and 220 may be selected from short circuit, resistor, diode, diode-configured transistor, or combination thereof, the amplifying circuit 212 may employ single-stage amplifying transistor, differential pair, cascode amplifying circuit, or cascade amplifying circuit. All of the components of the aforementioned amplifier 250 may be integrated in a single chip.

Figure 8:
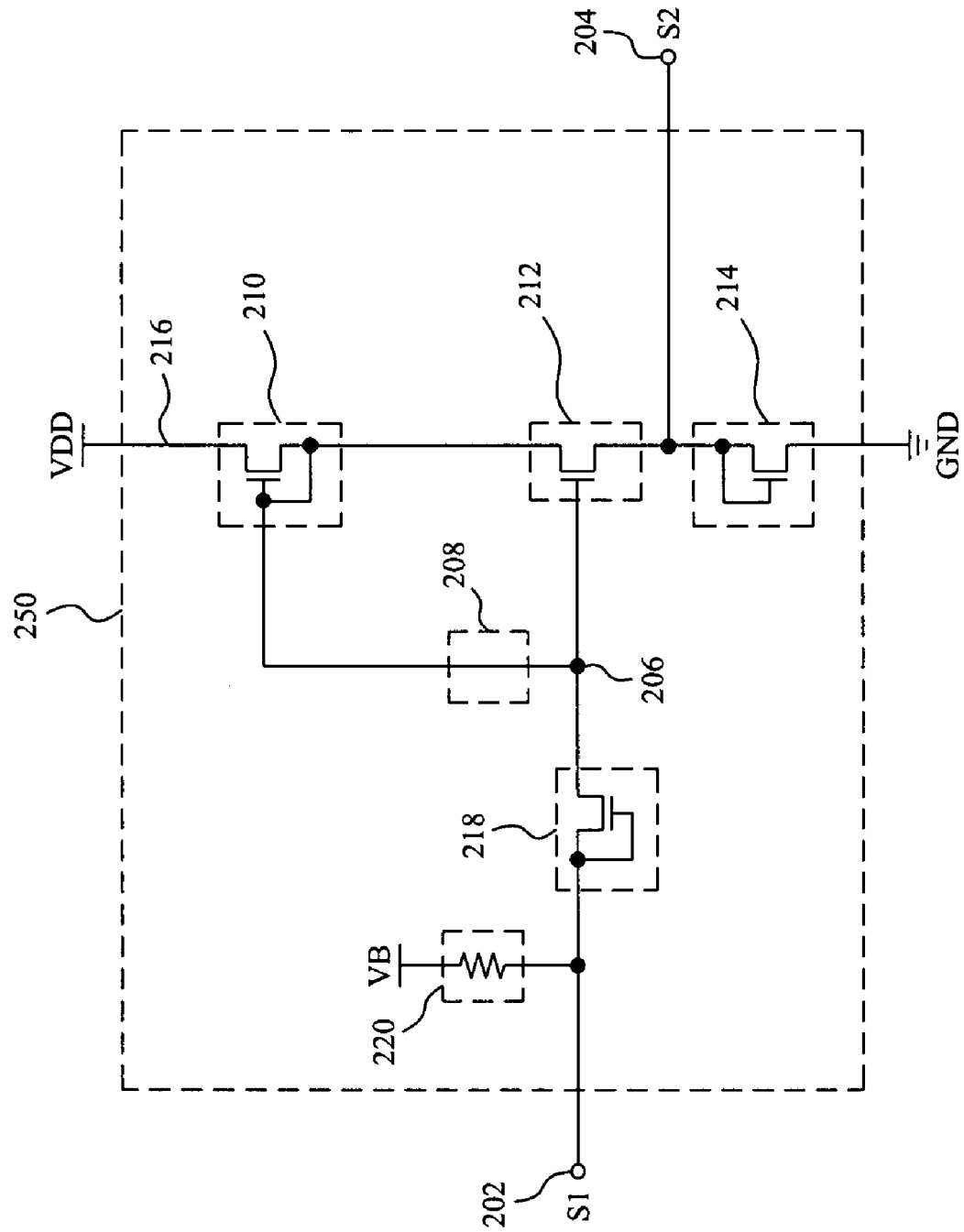
FIG. 8 shows an example of the amplifier in FIG. 7.

FIG. 8 shows an example of the amplifier in FIG. 7, in which the coupling circuit 218 is a diode-configured transistor, the bias circuit 220 is a resistor, the bias circuit 208 is a short circuit, the bias circuit 210 is a diode-configured transistor, the amplifying circuit 212 employs a single-stage amplifying transistor, such as NMOSFET, and the load 214 employs a diode-configured transistor.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. An amplifier comprising:
    a signal source input for receiving an input signal;
    an amplifying circuit for amplifying the input signal;
    a load in series connection to the amplifying circuit; and
    a self-bias circuit in series/shunt connection between an input of the amplifying circuit and the amplifying circuit for biasing the input of the amplifying circuit at a DC voltage;
    wherein the load and the self-bias circuit are arranged in a current path of the amplifying circuit and located at two opposite sides of the amplifying circuit, respectively.

2. The amplifier of claim 1, further comprising:
    a coupling circuit connected between the signal source input and the input of the amplifying circuit for coupling the input signal from the signal source input to the amplifying circuit, such that the signal source input and the input of the amplifying circuit are biased independently; and
    a bias circuit connected between a supply voltage and the signal source input for biasing the signal source input at a second DC voltage.

3. The amplifier of claim 2, wherein the coupling circuit comprises a capacitor connected between the signal source input and the input of the amplifying circuit.

4. The amplifier of claim 3, wherein the capacitor comprises a structure of polysilicon-insulation-diffusion, metal-insulation-diffusion, polysilicon-insulation-polysilicon, metal-insulation-polysilicon, or metal-insulation-metal.

5. The amplifier of claim 2, wherein the coupling circuit comprises a reverse-biased diode connected between the signal source input and the input of the amplifying circuit.

6. The amplifier of claim 2, wherein the coupling circuit comprises a diode-configured transistor between the signal source input and the input of the amplifying circuit.

7. The amplifier of claim 2, wherein the bias circuit comprises a resistor connected between the supply voltage and the signal source input.

8. The amplifier of claim 2, wherein the bias circuit comprises a reverse-biased diode connected between the supply voltage and the signal source input.

9. The amplifier of claim 2, wherein the bias circuit comprises a transistor configured to be a reverse-biased diode between the supply voltage and the signal source input.

10. The amplifier of claim 1, wherein the self-bias circuit comprises:
    a first bias circuit connected to the amplifying circuit; and
    a second bias circuit connected between the input of the amplifying circuit and the first bias circuit.

11. The amplifier of claim 10, wherein the first bias circuit comprises a short circuit connected to the amplifying circuit.

12. The amplifier of claim 10, wherein the first bias circuit comprises a resistor connected to the amplifying circuit.

13. The amplifier of claim 10, wherein the first bias circuit comprises a forward-biased diode connected to the amplifying circuit.

14. The amplifier of claim 10, wherein the first bias circuit comprises a transistor configured to be a forward-biased diode connected to the amplifying circuit.

15. The amplifier of claim 10, wherein the second bias circuit comprises a short circuit between the input of the amplifying circuit and the first bias circuit.

16. The amplifier of claim 10, wherein the second bias circuit comprises a resistor connected between the input of the amplifying circuit and the first bias circuit.

17. The amplifier of claim 10, wherein the second bias circuit comprises a reverse-biased diode connected between the input of the amplifying circuit and the first bias circuit.

18. The amplifier of claim 10, wherein the second bias circuit comprises a transistor configured to be a reverse-biased diode between the input of the amplifying circuit and the first bias circuit.

19. The amplifier of claim 2, wherein the first and second DC voltages are not equal to each other.

20. The amplifier of claim 1, wherein the amplifying circuit comprises a single-stage amplifying transistor.

21. The amplifier of claim 20, wherein the single-stage amplifying transistor comprises a NMOSFET or a PMOSFET.

22. The amplifier of claim 1, wherein the amplifying circuit comprises a differential pair.

23. The amplifier of claim 1, wherein the amplifying circuit comprises a cascode amplifying circuit.

24. The amplifier of claim 1, wherein the amplifying circuit comprises a cascade amplifying circuit.

* * * * *